United States Patent [19]
Casperson

[11] Patent Number: 5,812,375
[45] Date of Patent: Sep. 22, 1998

[54] ELECTRONIC ASSEMBLY FOR SELECTIVE HEAT SINKING AND TWO-SIDED COMPONENT ATTACHMENT

[75] Inventor: Paul G. Casperson, Colombus, Ind.

[73] Assignee: Cummins Engine Company, Inc., Columbus, Ind.

[21] Appl. No.: 643,511

[22] Filed: May 6, 1996

[51] Int. Cl.$^6$ ...................................................... H05K 7/20
[52] U.S. Cl. ...................... 361/707; 174/16.3; 165/80.3; 257/706; 257/712; 257/727; 361/713; 361/715; 361/719; 361/720
[58] Field of Search ................................. 165/80.2, 80.3, 165/185; 174/163, 252, 254; 257/706–707, 712–713, 718–719, 726–727; 361/704–710, 712–713, 715, 717–721, 749

[56] References Cited

U.S. PATENT DOCUMENTS

| | | |
|---|---|---|
| 4,628,407 | 12/1986 | August et al. ............................ 361/715 |
| 4,774,127 | 9/1988 | Reagan et al. . |
| 4,811,165 | 3/1989 | Currier et al. . |
| 4,858,071 | 8/1989 | Manabe et al. . |
| 4,922,324 | 5/1990 | Sudo . |
| 5,101,322 | 3/1992 | Ghaem et al. . |
| 5,103,375 | 4/1992 | Cottingham et al. . |
| 5,159,751 | 11/1992 | Cottingham et al. . |
| 5,170,326 | 12/1992 | Meny et al. . |
| 5,266,746 | 11/1993 | Nishihara et al. . |
| 5,276,418 | 1/1994 | Klosowiak et al. . |
| 5,310,966 | 5/1994 | Iida et al. . |
| 5,402,313 | 3/1995 | Casperson et al. ...................... 361/710 |
| 5,523,919 | 6/1996 | Canova .................................... 361/720 |
| 5,615,087 | 3/1997 | Wieloch ................................... 361/719 |
| 5,616,888 | 4/1997 | McLaughlin et al. .................. 174/254 |

*Primary Examiner*—Gregory D. Thompson
*Attorney, Agent, or Firm*—Woodard, Emhardt, Naughton, Moriarty & McNett

[57] ABSTRACT

An electronic assembly includes a flex-rigid circuit board having a flexible polyimide layer disposed on the upper side of a rigid substrate, conductive circuit paths formed within the substrate and on the polyimide layer, and a base for dissipating heat generated by electrical components mounted on the circuit board. The flex-rigid circuit board has a cavity therein extending from a lower electrical insulation layer through the rigid substrate to the upper polyimide layer. A heat-generating electrical component is mounted on the upper layer over the cavity in the circuit board. The base has a boss that protrudes into the cavity and contacts the upper polyimide layer such that heat from the electrical component is conducted through the upper polyimide layer and into the base. Cool electrical components requiring no heat sinking are mounted on the lower insulation layer and/or the upper polyimide layer. Thus, the electronic assembly allows for two-sided attachment of electrical components to the flex-rigid circuit board while providing selective heat sinking for only the heat-generating components.

31 Claims, 3 Drawing Sheets

ELECTRONIC ASSEMBLY FOR SELECTIVE HEAT SINKING AND TWO-SIDED COMPONENT ATTACHMENT

FIELD OF THE INVENTION

The present invention relates generally to an electronic circuit assembly and more particularly to an electronic circuit assembly providing two-sided component mounting and selective heat sinking for heat-generating electrical components.

BACKGROUND OF THE INVENTION

Concomitant with the ever-increasing density with which electronic components are mounted on circuit boards and with the use of high-power, heat-generating integrated circuits or other heat-generating electronic components comes the need to provide a means of dissipating the heat generated by these components so that it does not damage other electronic components located nearby. Circuit boards are often mounted on one side thereof to a heat sinking base plate in an effort to dissipate heat generated by electrical components mounted to an opposite side of the circuit board. In such an arrangement, heat generated by the electrical components is conducted through the substrate of the circuit board and into the base plate.

Additionally, the desire to make electronic equipment as compact as possible has led to the use of flexible polyimide disposed on a rigid substrate. Since polyimide is an electrical insulator, it can be used to provide electrical insulation between multiple layers of circuit paths, thus forming a stack of circuit layers on the substrate. The stacking of circuit paths permits a reduction in the surface area of the circuit board that is dedicated to providing the electrical links between the electronics. The electrical components, interconnected by various circuit paths, are then mounted on the top polyimide layer of the resulting flex-rigid circuit board. Flex-rigid circuit boards having either single or multiple circuit layers have been disclosed in, for example, U.S. Pat. Nos. 4,811,165 to Currier et al., U.S. Pat. No. 4,858,071 to Manabe et al., U.S. Pat. No. 5,103,375 to Cottingham et al., and U.S. Pat. No. 5,266,746 to Nishihara et al.

FIG. 1, illustrating the basic elements of a single-layer flex-rigid circuit board assembly, is intended to be generally representative of these prior art references. Circuit board assembly 6 includes flex-rigid circuit board 8 comprising rigid substrate 2 and polyimide layer 3 disposed on the top surface of rigid substrate 2. A circuit pattern formed by thin copper traces 5 is provided on polyimide layer 3, and electrical components 4 mounted on top of polyimide layer 3 are interconnected by copper traces 5. The lower surface of substrate 2 is adhered by suitable means, such as by gluing or soldering, or laminated to base plate 1 which acts as a heat sink in order to dissipate heat generated by electrical components 4 and conducted by polyimide layer 3 and substrate 2 to base plate 1.

In the circuit board assembly depicted in FIG. 1, substrate 2 is mounted to base plate 1 over substantially the entire lower surface of substrate 2. Consequently, electrical components 4 can be practically be mounted on only one side of the flex-rigid circuit board 8 because the other side of circuit board 8 is dedicated to providing a surface area in contact with base plate 1 in order to conduct heat to the heat sink. Thus, one drawback inherent in the prior art circuit board assembly is that the resulting usable surface area on which electronics and circuitry can be mounted is limited to the top surface of the flex-rigid circuit board. What is therefore needed is a technique for selectively dissipating heat generated by the electrical components in order to free up at least a portion of the bottom surface of the substrate for mounting additional circuitry thereto.

SUMMARY OF THE INVENTION

An object of the present invention therefore lies in providing an electronic circuit assembly with increased surface area on which electrical components and circuits can be mounted. A further object is to provide adequate heat sinking for the heat-generating electrical components mounted on the flex-rigid circuit board of the electronic assembly.

To these ends, an electronic assembly is described that not only allows for attachment of components to both sides of the circuit board, but also dissipates heat by selectively heat sinking only the heat-generating components. This electronic assembly includes a flex-rigid circuit board having a electrical insulation layers disposed on both sides of a substrate. Circuit patterns of thin copper traces are formed within the substrate, as well as on the insulation layers. Only cool electrical components, i.e., those generating little or no heat, are mounted on the lower insulation layer, whereas all heat-generating components requiring heat sinking are mounted on the upper insulation layer.

Heat sinking then is provided selectively to only those electrical components that are mounted on the upper insulation layer and that generate heat. Beneath each heat-generating component, the flex-rigid circuit board defines a cavity extending through the lower insulation layer and the substrate, and terminating at the upper insulation layer. The heat sink is then provided by a base plate having a boss that protrudes into the cavity and contacts the upper insulation layer just beneath the heat-generating component. The heat from the component is conducted to the boss of the base plate by the upper layer, and is thereafter dissipated into the boss of the base plate. Thus, instead of the under side of the substrate being mounted to the heat sink as in the prior art, it supports a second insulation layer containing additional circuit patterns, thereby substantially increasing the available circuit layer area of existing flex-rigid circuit boards.

To ensure adequate heat sinking, the boss of the base plate must be in thermally conductive contact with the upper insulation layer which is disposed between the heat-generating electrical component and the boss. A means for providing such contact between the boss and the upper layer may be provided by a thermal adhesive disposed therebetween. Alternatively, a thermally conductive grease may be used. In order to maintain sufficient pressure of the upper layer against the grease and the boss, one end of a compressed spring is attached to the top of the electrical component, and the other end of the spring is attached to a cover located above the component. The spring ensures that the heat-generating component presses against the upper layer which in turn presses against the grease and boss. Another alternative embodiment includes forming a copper pad on the under side of the upper layer opposite the boss and forming a solder contact between the copper pad and the boss of the base plate.

DETAILED DESCRIPTION OF THE PREFERRED EMBODIMENT

Figure 1:
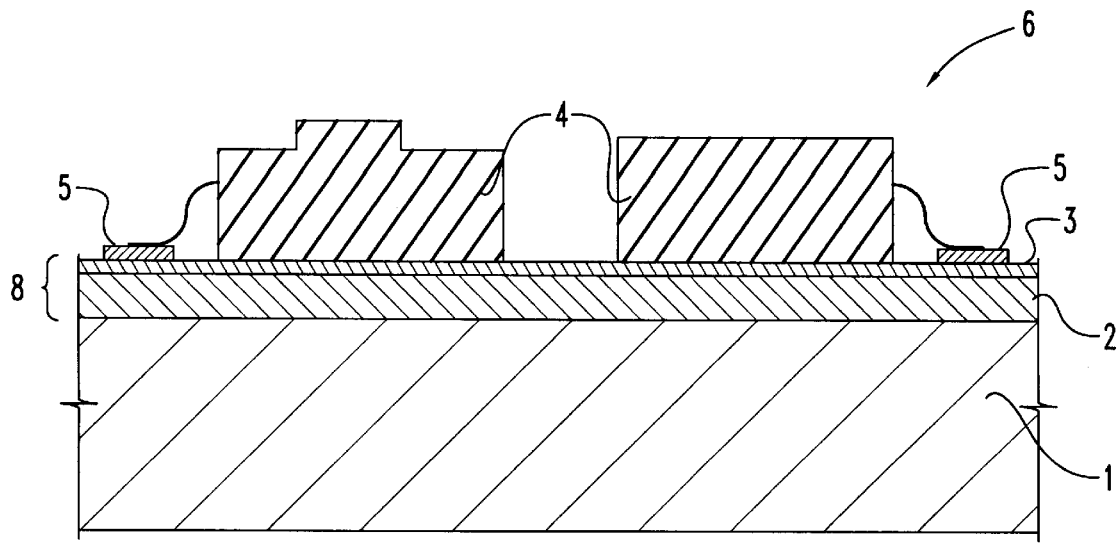
FIG. 1 is a cross-sectional view illustrating a known flex-rigid circuit assembly.

For the purposes of promoting an understanding of the principles of the invention, reference will now be made to the embodiment illustrated in the drawings and specific language will be used to describe the same. It will nevertheless be understood that no limitation of the scope of the invention is thereby intended, any alterations and further modifications in the illustrated device, and any further applications of the principles of the invention as illustrated therein being contemplated as would normally occur to one skilled in the art to which the invention relates.

Figure 2:
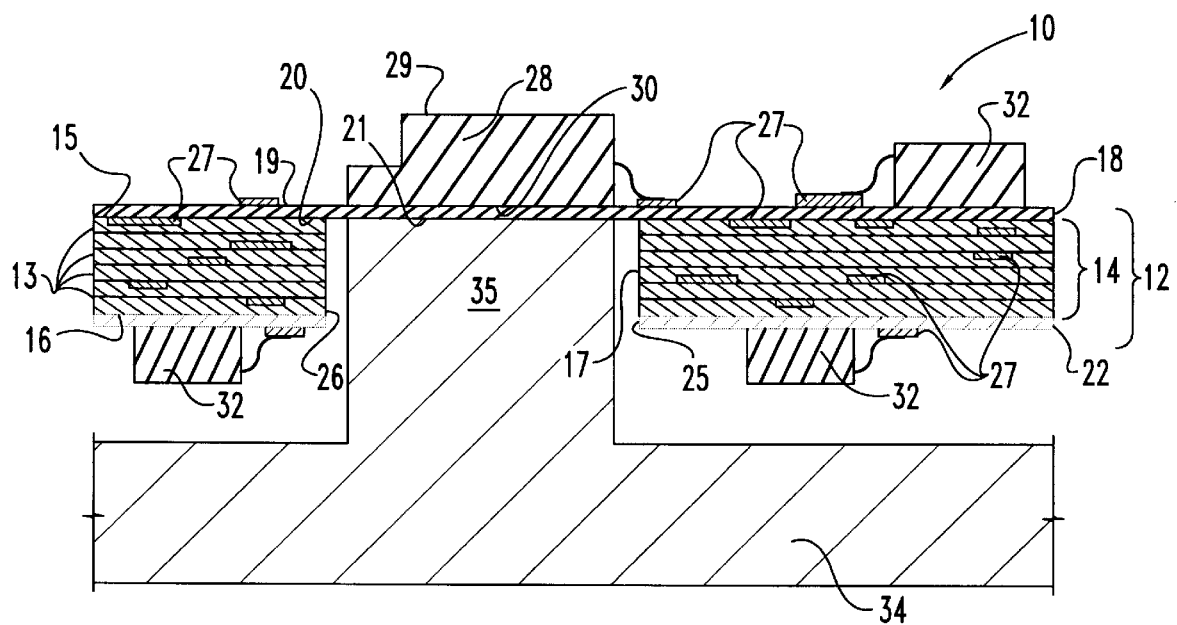
FIG. 2 is a cross-sectional view illustrating one aspect of the electronic assembly of the present invention.

Referring now to the drawings in detail, wherein identical numerals indicate the same elements throughout the figures, FIG. 2 illustrates flex-rigid circuit board assembly 10 having two-sided electrical component attachment and selective heat-sinking for the heat-generating components. Flex-rigid electronic assembly 10 comprises non-heat-generating electrical components 32 and heat-generating electrical component 28 mounted on flex-rigid circuit board 12 and further includes base 34 to provide the requisite heat sinking for heat-generating component 28. Although only one heat-generating component is shown in FIG. 2, the present invention contemplates an electronic assembly having multiple heat-generating components, each provided heat sinking to base 34. Further, although electrical components 32 have been described as non-heat-generating, they may be any electrical components requiring no heat sinking provisions.

Flex-rigid circuit board 12 includes rigid substrate 14, upper electrical insulation layer 18 disposed on upper surface 15 of substrate 14, and lower electrical insulation layer 22 disposed on lower surface 16 of substrate 14. Substrate 14 may be made of glass, ceramic, polyimide, or metal, such as aluminum; however, it is preferably made of about 6–12 layers of glass cloth laminated with epoxy. Conductive paths 27 preferably formed of copper are deposited on the upper surface 15 of substrate 14, on the lower surface 16 of substrate 14, or on any internal surface of the multiple glass-epoxy laminate layers 13. Conductive paths may also be deposited on upper and lower insulation layers 18 and 22, respectively. Heat generating component 28 is located on upper surface 19 of upper insulation layer 18. Furthermore, substrate 14 defines a bore 17 therein, and the size of bore 17 approximates that of heat-generating component 28 which is located directly above bore 17. Upper insulation layer 18 has portion 21 thereof extending across bore 17 of substrate 14. Lower surface 30 of heat-generating component 28 is mounted on portion 21 of insulation layer 18. Lower insulation layer 22 also defines a bore 25 extending therethrough, and bore 25 is of a size and location commensurate with bore 17 of substrate 14. Thus, bore 25 in lower insulation layer 22 and bore 17 of substrate 14 define cavity 26 in flex-rigid circuit board 12, wherein cavity 26 extends from lower insulation layer 22 through upper surface 15 of substrate 14 to upper insulation layer 18. Cavity 26 may or may not extend into upper insulation layer 18; however, cavity 26 may not extend through upper insulation layer 18.

Upper insulation layers 18 must act as a thermal conductor, as well as an electrical insulator. Polyimide is a flexible material commonly used for this dual purpose. Although upper insulation layer 18 may comprise a single layer of glass-epoxy laminate, layer 18 is preferably a single layer of polyimide film since the polyimide is more flexible, tear resistant, and puncture resistant than a single layer of glass-epoxy laminate. Lower insulation layer 22 may also comprise a single layer of polyimide; however, layer 22 is preferably glass-epoxy laminate since flexibility is not required on lower surface 16 of substrate 14 and since the glass-epoxy laminate is more cost-efficient than the polyimide film. Conductive paths 27 formed between glass-epoxy laminate layers 13 and on upper and lower insulation layers 18 and 22, respectively, interconnect electrical components 28 and 32 mounted on flex-rigid circuit board 12. Only cool electrical components 32, i.e., those generating little or no heat, are mounted on the underneath side of flex-rigid circuit board 12; whereas, all heat-generating electrical components 28 requiring heat sinking are mounted on upper insulation layer 18. Electrical components 32 are preferably soldered directly to conductive paths 27 that are formed on the lower surface 16 of substrate 14; alternatively, they can be mounted on lower insulation layer 22 as shown by the phantom lines in FIG. 2. Additionally, cool electrical components 32 can also be mounted on upper insulation layer 18. Electrical components 28 and 32 may be electrically connected to conductive paths 27 via known techniques such as soldering, for example.

Figure 3:
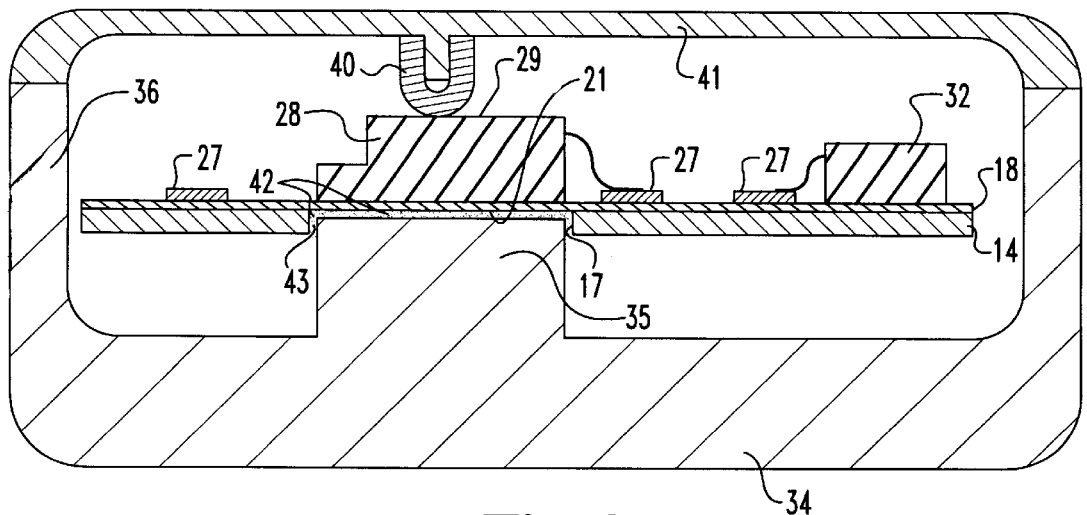
FIG. 3 is a cross-sectional view, according to one embodiment of the present invention, in which thermal adhesive provides the means for establishing thermal contact between the upper layer and the boss.
Figure 4:
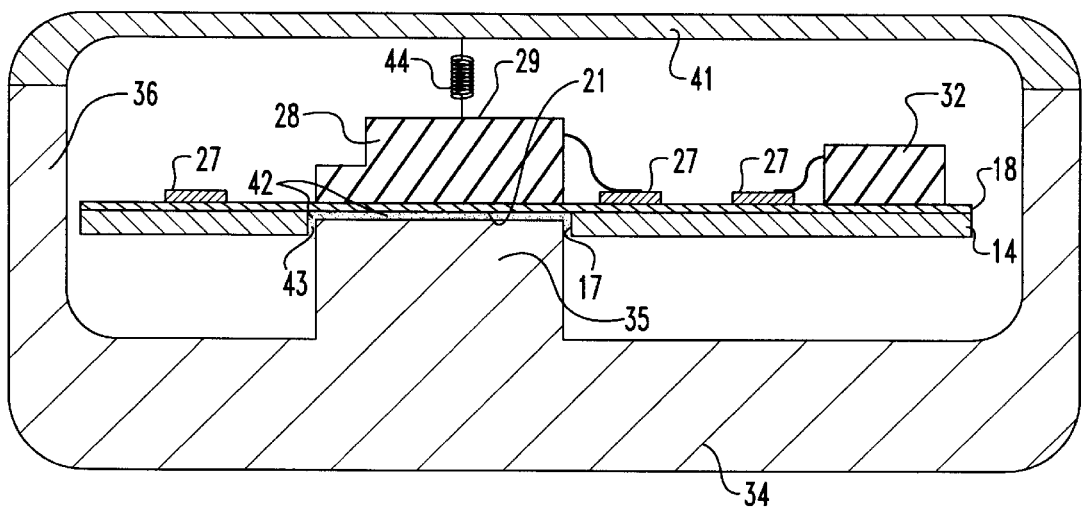
FIG. 4 is a cross-sectional view, according to another embodiment of the present invention, in which thermally conductive grease and a compressed spring provide the means for establishing thermal contact between the upper layer and the boss.

The heat sink of electronic assembly 10 is provided by thermally conductive base 34, which may form a portion of housing 36 for electronic assembly 10 as shown in FIGS. 3 and 4. Base 34 is preferably made of metal such as aluminum, copper, or magnesium; moreover, for the price, strength, and thermal conductivity, aluminum is preferred. Boss 35 of base 34 protrudes through bore 25 of lower insulation layer 22 and through bore 17 of substrate 14; thus, boss 35 protrudes into cavity 26 of flex-rigid circuit board 12. Preferably, boss 35 is an integral extension of boss 34, although the present invention contemplates that boss 35 may be a separate component which is rigidly secured, both mechanically and thermally, to boss 34.

In order to conduct heat from upper insulation layer 18 to the heat sink base 34, flex-rigid electronic assembly 10 further includes means for contacting insulation layer 18 and boss 35 in a thermally conducting relationship. Upper insulation layer 18 is preferably sufficiently thin to provide for significant thermal conductivity between component 28 and boss 35 of base 34. Thus, heat generated by component 28 is conducted into upper electrical insulation layer 18 through contact of lower surface 30 of component 28. with layer 18. The heat is further conducted from layer 18, preferably through a thermally conductive medium, to boss 35, and dissipated into base 34. No similar heat-sinking arrangement is provided for cool electrical components 32 mounted on lower insulation layer 22 or on upper insulation layer 18. Consequently, by contacting the heat sink and the insulation layer only in areas where heat transfer is required, electronic assembly 10 allows two-sided attachment of electrical components to flex-rigid circuit board 12 while providing selective heat sinking for only heat-generating components.

Figure 5:
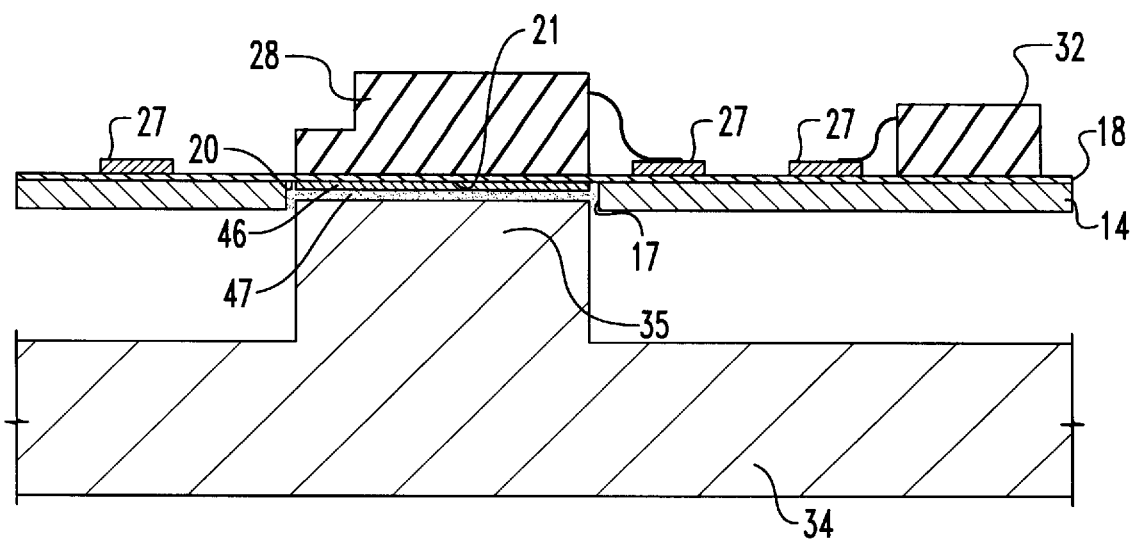
FIG. 5 is a cross-sectional view, according to yet another embodiment of the present invention, in which a copper pad and solder provide the means for establishing thermal contact between the upper layer and the boss.

FIGS. 3–5 illustrate alternative embodiments of the means for establishing thermal contact between upper insulation layer 18 and boss 35. For simplicity, the flex-rigid circuit boards shown in each of these figures have no lower insulation layer; furthermore, the detail of the multiple glass-epoxy laminate layers 13 of substrate 14 is omitted.

The thermally conductive medium between upper layer 18 and boss 35 depicted in FIG. 3 is adhesive 42 disposed between boss 35 and portion 21 of layer 18 extending across bore 17 of substrate 14. Additionally, adhesive 42 may also fill the gap 43 between substrate 14 and boss 35. Adhesive 42 must be thermally conducting in order to permit heat generated by component 28 to be conducted from layer 18 into boss 35; moreover, it must adhere to layer 18, base 34, and, preferably, substrate 14.

To retain the proper orientation of the electrical component, circuit board, and heat sink during gluing, biasing member 40 extends from cover 41, contacts upper surface 29 of heat-generating component 28, and biases component 28 toward boss 35. The resultant pressure on component 28 presses portion 21 of layer 18 into adhesive 42. Cover 41, preferably made of aluminum, must be stiff enough to impart adequate pressure to biasing member 40. Biasing member 40 prevents crushing of component 28 by cover 41. Since high pressure is not required to be applied to component 28, biasing member 40 may be made of rubber without fear of failure due to creep. The pressure provided by biasing member 40 is required only for in-place fixturing of boss 35 in relation to the flex-rigid circuit board 12 during cure of adhesive 42. Hence, after cure, biasing member 40 may be removed; alternatively, it may be retained to provide some vibration damping during use of the electronic assembly.

An alternative to biasing member 40 is depicted in FIG. 4 as compressed spring 44. One end of spring 44 is attached to cover 41, and the other end is attached to upper surface 29 of heat-generating component 28. Spring 44 must be in a compressed state so that it presses component 28 against layer 18 which in turn presses into adhesive 42. In order to reduce thermal resistance between portion 21 of layer 18 and boss 35, thermally conductive grease, instead of adhesive 42, can be disposed therebetween. Heat in layer 18 is then conducted through grease into boss 35. If grease 45 is utilized, spring 44 must be retained in the electronic assembly; otherwise, contact between layer 18 and boss 35 may be lost.

Another means for establishing thermal contact between insulation layer 18 and boss 35 is illustrated in FIG. 5. Conductive pad 46, preferably made of copper, is attached to lower surface 20 of portion 21 of layer 18 extending across bore 17 of substrate 14. Eliminating the need for a biasing member or a spring, low-temperature solder 47 is disposed between conductive pad 46 and boss 35 and allows for the thermal conduction of heat from layer 18 through conductive pad 46 and solder 47 to boss 35 of base 34.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A electronic assembly for providing a heat sink for a heat-generating electrical component, said assembly comprising:
   a substrate having an upper surface and a lower surface and defining a bore therethrough;
   a first thermally conductive electrical insulation layer disposed on said upper surface of said substrate, said layer having the heat-generating electrical component in contact therewith over said bore;
   a heat sink defining a boss extending therefrom and into said bore adjacent said first insulation layer; and
   a thermally conductive medium disposed within said bore in contact with said boss and said first insulation layer.

2. The electronic assembly in claim 1, wherein said thermally conductive medium is formed of a thermally conducting adhesive.

3. The electronic assembly in claim 2, wherein said thermally conducting adhesive is further in contact with said substrate.

4. The electronic assembly in claim 2, further comprising a cover having a biasing member extending therefrom and in contact with an upper surface of the electrical components, said biasing member biasing the electrical component toward said boss.

5. The electronic assembly in claim 1, wherein said thermally conductive medium is formed of a thermally conductive grease disposed between said boss and said first insulation layer.

6. The electronic assembly in claim 5, further comprising a cover and a compressed spring having a first end attached to said cover and a second end attached to an upper surface of said heat-generating electrical component.

7. The electronic assembly in claim 1, further including a thermally conductive pad attached to a lower surface of said first insulation layer opposite said boss.

8. The electronic assembly in claim 7, wherein said thermally conductive medium is formed of solder disposed between said pad and said boss.

9. The electronic assembly in claim 1, wherein said first insulation layer is polyimide.

10. The electronic assembly in claim 1, further comprising a second electrical insulation layer disposed on said lower surface of said substrate and terminating adjacent said bore.

11. The electronic assembly in claim 10, wherein said second insulation layer is polyimide.

12. The electronic assembly in claim 10, further comprising conductive paths disposed on said first and said second insulation layers.

13. The electronic assembly in claim 10, further comprising electrical components generating little or no heat mounted on said second insulation layer.

14. The electronic assembly in claim 1, wherein said substrate comprises alternating layers of glass-epoxy laminate and conductive paths between said glass-epoxy laminate.

15. The electronic assembly in claim 14, further comprising conductive paths disposed on said substrate and electrical components generating little or no heat mounted on said conductive paths.

16. The electronic assembly in claim 1, further comprising a housing, wherein said heat sink forms a portion of said housing.

17. An electronic assembly comprising:
   a substrate having an upper surface, an opposite lower surface and defining a bore therethrough;
   a first thermally conductive insulation layer disposed on said upper surface of said substrate;
   a heat-generating electrical component mounted to said first insulation layer over said bore;
   an electrical component generating little or no heat mounted to said lower surface of said substrate; and a thermally conductive base having a boss extending therefrom into said bore and in thermal contact with said first insulation layer under said heat-generating electrical component.

18. The electronic assembly in claim 17, further comprising a housing, wherein said thermally conductive base forms a portion of said housing.

19. The electronic assembly in claim 17, further comprising a second insulation layer disposed on said lower surface of said substrate and terminating adjacent said bore.

20. The electronic assembly in claim 19, wherein said electrical component generating little or no heat is mounted to said second insulation layer.

21. The electronic assembly in claim 17, further comprising conductive paths disposed on said first insulation layer.

22. The electronic assembly in claim 17, wherein said substrate comprises alternating layers of glass-epoxy laminate and conductive paths between said glass-epoxy laminate.

23. The electronic assembly in claim 22, wherein said first insulation film is polyimide.

24. The electronic assembly in claim 17, further comprising means for establishing a thermally conductive path between said boss and said first insulation layer.

25. The electronic assembly in claim 24, wherein said thermally conductive path means comprises a thermally conducting adhesive.

26. The electronic assembly in claim 25, further comprising a cover having a biasing member extending therefrom and in contact with an upper surface of the electrical component, said biasing member biasing the electrical component toward said boss.

27. The electronic assembly in claim 24, wherein said thermally conductive path means comprises a thermally conductive grease disposed between said boss and said first insulation layer under said heat-generating electrical component.

28. The electronic assembly in claim 27, further comprising a cover and a compressed spring having a first end attached to said cover and a second end attached to an upper surface of said heat-generating electrical component.

29. The electronic assembly in claim 24, further including a thermally conductive pad attached to a lower surface of said first insulation layer opposite said boss.

30. The electronic assembly in claim 29, wherein said thermally conductive path means comprises solder disposed between said pad and said boss.

31. An electronic assembly comprising:

a flex rigid circuit board including a substrate having an upper surface and a lower surface, a thermally conductive electrical insulation layer disposed on said upper surface of said substrate, and conductive paths deposited within said substrate and on said insulation layer;

said flex-rigid circuit board defining a cavity therein, said cavity extending from said lower surface of said substrate through said upper surface of said substrate and terminating at said insulation layer;

a heat-generating electrical component in contact with said insulation layer over said cavity;

an electrical component generating little or no heat and mounted to said lower surface of said substrate;

a thermally conductive base having a boss protruding into said cavity; and a thermally conductive medium disposed within said cavity in contact with said boss and said insulation layer.

* * * * *

UNITED STATES PATENT AND TRADEMARK OFFICE
CERTIFICATE OF CORRECTION

PATENT NO. : 5,812,375
DATED : September 22, 1998
INVENTOR(S) : Paul G. Casperson It is certified that error appears in the above-identified patent and that said Letters Patent is hereby corrected as shown below:

In Col. 5, at line 45, delete "42" after "grease".

Signed and Sealed this

Twenty-sixth Day of January, 1999

Attest:

Attesting Officer

*Acting Commissioner of Patents and Trademarks*